1/24/84 OR 4,427,912

United States Patent [19]

Bui et al.

[11] 4,427,912

[45] Jan. 24, 1984

[54] ULTRASOUND TRANSDUCER FOR ENHANCING SIGNAL RECEPTION IN ULTRASOUND EQUIPMENT

[75] Inventors: Tuan S. Bui, Rydalmere; John A. Sherlock, North Manly, both of Australia

[73] Assignee: Ausonics Pty. Ltd., Lane Cove, Australia

[21] Appl. No.: 377,612

[22] Filed: May 13, 1982

[51] Int. Cl.[3] .............................................. H01L 41/04

[52] U.S. Cl. .................................... 310/322; 310/334; 310/800

[58] Field of Search .................. 73/632, 644; 310/317, 310/319, 334, 800, 325, 327, 322; 333/141, 142

[56] References Cited

U.S. PATENT DOCUMENTS 4,276,491 6/1981 Daniel ................................ 310/317

4,356,422 10/1982 van Maanen ........................ 310/322

*Primary Examiner*—J. D. Miller
*Assistant Examiner*—D. L. Rebsch
*Attorney, Agent, or Firm*—Gottlieb, Rackman & Reisman

[57] ABSTRACT

An ultrasonic transducer assembly having three layers. The front and back layers are made of piezoelectric materials, and are acoustically matched by the intermediate layer. The back layer functions as an ultrasound transmitter, and the front layer functions both as a transmission matching layer and as an ultrasound receiver. During reception, by delaying the signal which is generated by the front layer so that it is in phase with a signal which appears across the back layer and then adding them together, the back layer also functions to enhance the received signal.

4 Claims, 2 Drawing Figures

ULTRASOUND TRANSDUCER FOR ENHANCING SIGNAL RECEPTION IN ULTRASOUND EQUIPMENT

Figure 1:
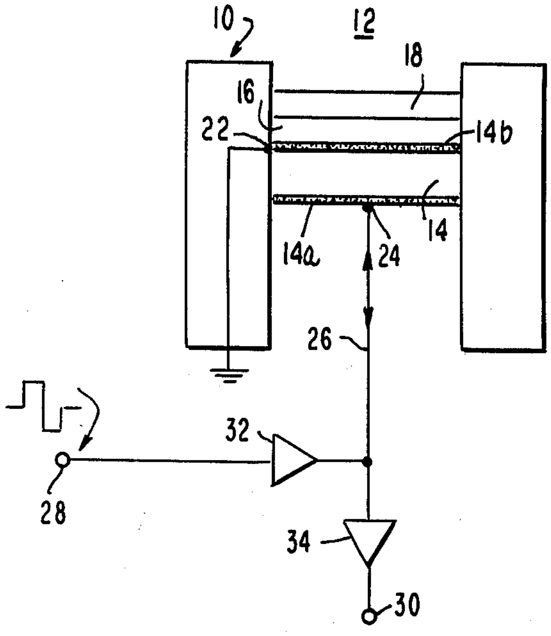
FIG. 1 PRIOR ART

This invention relates to transducer assemblies for ultrasound equipment, and more particularly to a transducer assembly which is highly efficient in both transmitting ultrasonic energy to, and receiving ultrasonic energy from, a coupled medium.

In conventional ultrasound imaging equipment, such as that used for medical diagnosis, a transducer or a set of transducers are used to transmit ultrasound to an interrogation medium, and to receive ultrasonic reflections from the interrogation medium. The term "interrogation medium" refers to the medium which is acoustically coupled to the transducer assembly; for example, the interrogation medium can be a human body, a water bath, or a piece of metal.

One of the biggest problems with prior art transducers relates to their efficiencies. A transducer usually consists of a layer of piezoelectric material, and possibly one or two quarter-wave matching layers. The matching layers are used to match the widely different acoustical impedances of the piezoelectric material and the coupling, or interrogation, medium. It is well known that the shorter a pulse of ultrasonic energy, the greater the resolution of the ultrasound equipment. But in order to provide a short ultrasound pulse, the transducer assembly must have a large bandwidth. This requires matching of the acoustical impedances of the layers which make up the transducer assembly. Ideally, the acoustical impedance of each layer should be equal to the geometric mean of the acoustical impedances of the two adjacent layers (or the interrogation medium, in the case of the front layer of the transducer assembly).

If the back layer of a transducer assembly is the piezoelectric element, it is well known that it should have a thickness equal to one-half wavelength. A coating used to match this layer with an interrogation medium such as water should have a thickness equal to one-quarter wavelength as is known in the art, to maximize the coupling efficiency. The poorer the coupling, the narrower the bandwidth of the system and the worse the resolution.

For the most part, prior art transducer assemblies have been two-layer assemblies which have utilized only a single layer of material for coupling the piezoelectric layer to the interrogation medium. One of the best prior art transducer assemblies, however, is a three-layer device. Providing another layer generally increases the bandwidth, although the overall efficiency does not increase significantly. The piezoelectric layer, at the back of the device, is coupled through a glass layer to a layer of araldite, the latter serving to couple ultrasound to the interrogation medium. The acoustical impedances of the three layers, in units of $10^6$ Rayl, are respectively 36, 10, and 3.5, with the acoustical impedance of water being 1.5. It will be seen that the acoustical impedance of the glass layer is approximately equal to the geometric mean of the front and back layers of the assembly, and the acoustical impedance of the araldite layer is approximately equal to the geometric mean of the acoustical impedances of the glass layer and the interrogation medium. The matching, of course, is not perfect, and the maximum bandwidth achievable with prior art transducer assemblies is about 70%. (This means that the 3-dB points are at 1.35F and 0.65F, where F is the center frequency.)

Some prior art transducer assemblies have utilized a single layer of piezoelectric polymer, such as polyvinylidene fluoride (PVDF). This material has an acoustical impedance of about $3.2\times10^6$ Rayl; as such, the acoustical impedance is low enough to provide good coupling to a water interrogation medium. But while PVDF is better than piezoelectric ceramics when it comes to coupling ultrasound to the interrogation medium, the polymer has a poor electrical-mechanical efficiency.

It is a general object of our invention to provide a transducer assembly which is very efficient insofar as its coupling to an interrogation medium is concerned.

It is another object of our invention to provide a transducer assembly which provides increased bandwidth and thus allows better resolutions than have been possible in the prior art.

In accordance with the principles of our invention, a three-layer transducer assembly is provided, the front layer of which is made of PVDF material. The material has an impedance which is approximately as low as that of araldite, so that the transmission is as efficient as that of the prior art three-layer assembly described above. But we provide the PVDF layer with electrode coatings on its opposed surfaces, and it functions as the receiving element. Because of the highly efficient coupling to the interrogation medium, increased bandwidth is achieved despite the fact that the mechanical-electrical efficiency is low.

Further in accordance with the principles of our invention, a received signal can be enhanced by adding to it the echo signal which actually appears across the piezoelectric layer. The received signal across the front and back layers are out of phase by one wavelength if the back layer used for transmission is one-half wavelength thick and the two other layers are each one-quarter wavelength thick. Thus if the received signal across the front layer is delayed by one wavelength and then added to the signal which appears across the back layer, the signal across the back layer can be made to enhance the signal which is received across the front layer.

Figure 2:
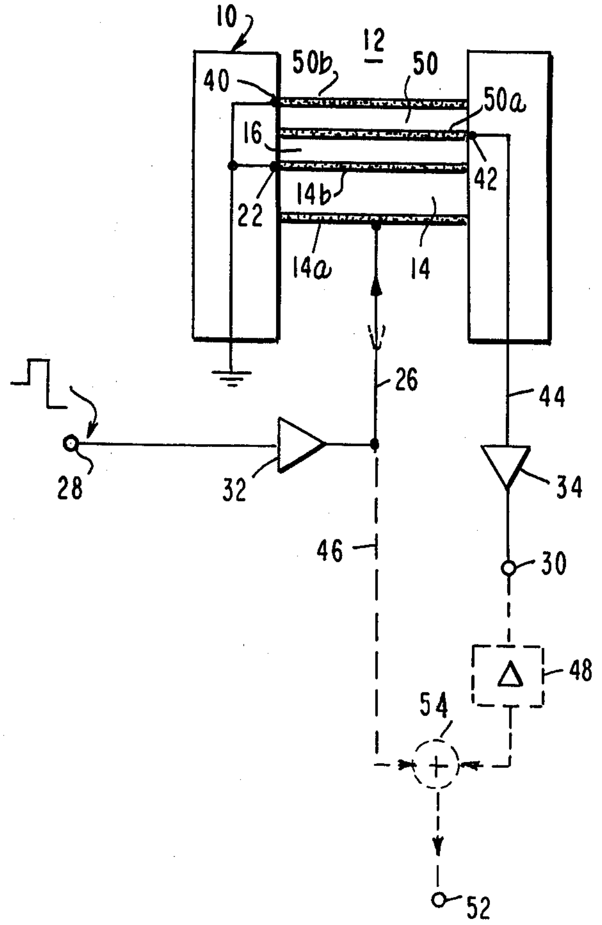

Further objects, features and advantages of our invention will become apparent upon consideration of the following detailed description in conjunction with the drawing, in which:

FIG. 1 depicts symbolically a three-layer prior art transducer assembly; and FIG. 2 depicts symbolically the illustrative embodiment of our invention.

In the prior art transducer assembly of FIG. 1, the same piezoelectric material 14 is used for transmitting and receiving ultrasonic signals. FIG. 1 is a cross-sectional view and depicts piezoelectric material 14 mounted in a conventional manner in circular housing 10. Material 14 has two electrode coatings **14*a*, 14*b*, as is known in the art. Coating 14*b* is connected at 22 to a conductor which is grounded. (Connection to electrode coating 14*b* in FIG. 1 is shown as being through the wall of the housing, although holes could be drilled through one or more of the elements to provide a connection, as is known in the art.) Coating 14*a* is connected at 24 to a conductor 26 which is extended to both the output of transmitting amplifier 32 and the input of receiving amplifier 34. To transmit a pulse of ultrasonic energy, a bipolar electrical pulse is applied to input terminal 28, as shown. Typically, the bipolar pulse has a duration of 0.33 microseconds to provide an operating frequency of 3 MHz. The application of the pulse to the piezoelectric layer 14 causes it to vibrate, with an ultrasonic signal being transmitted to the interrogation medium shown by the numeral 12. Two quarter-wave matching layers 16 and 18 are provided. As described above, layer 14 may be made of a ceramic material with an acoustical impedance of $36\times10^6$ Rayl. If the interrogation medium is water, the matching layers 16 and 18** should have acoustical impedances of $10\times10^6$ Rayl and $3.5\times10^6$ Rayl respectively. The two matching layers could be made of fused quartz glass and araldite, respectively.

In this prior art system, the piezoelectric layer 14 serves as an electrical-mechanical transducer and as a mechanical-electrical transducer. During transmission, the electrical signal at the output of amplifier 32 results in vibration of the piezoelectric layer so that a pulse of ultrasound is transmitted to the interrogation medium. During reception, an incoming ultrasound signal is converted by the transducer into an electrical signal which is then amplified by amplifier 34.

The transducer assembly of FIG. 2 is in certain respects similar to that of FIG. 1, and toward this end the same reference numerals have been used where appropriate. The most important difference between the two transducer assemblies is that while the prior art assembly of FIG. 1 utilizes a non-piezoelectric layer 18 (araldite), the assembly of FIG. 2 uses a piezoelectric layer 50 instead. This layer has two electrode coatings **50*a*, 50*b*. Coating 50*b* is grounded, as shown by the numeral 40, as is the front electrode coating of piezoelectric element 14. Also, instead of conductor 26 being extended to the input of receiving amplifier 34, electrode coating 50*a* is coupled via connection 42 and conductor 44 to the input of this amplifier. Piezoelectric element 14 in FIG. 2 is used for transmission purposes, just as it is used in the prior art transducer assembly. But while the same element is used for receiving echo signals with the transducer assembly of FIG. 1, the primary element for receiving echo signals with the transducer of FIG. 2 is piezoelectric element 50. Matching layer 16 is the same in both cases, and may be made of fused quartz glass. Piezoelectric element 50 in FIG. 2** is preferably made of a piezoelectric polymer such as PVDF. This material has an acoustical impedance of $3.5\times10^6$ Rayl so that it is a superior matching layer to a water interrogation medium; it thus serves as an excellent receiving element.

The transducer assembly of FIG. 2 consists of at least two different piezoelectric materials. While an intermediate non-piezoelectric layer is provided, it is provided for matching purposes and is not essential (although it is highly preferred).

The arrangement of FIG. 2 does not use the same element of piezoelectric material for both transmission and reception. Transmitting and receiving efficiencies are maximized by using different piezoelectric elements. However, element 14, while its primary purpose is to control transmission, can also be used to advantage for enhancing the received signal. This is symbolized by the elements shown by the dashed lines in FIG. 2.

One of the primary advantages of using the same transducer assembly for both transmitting and receiving is that only a single element need be provided in an overall system. Furthermore, "line of sight" problems are avoided because the transmitted ultrasound and the received echo travel along the same path. Element 14 has a thickness equal to one-half wavelength of the transmitted acoustical signal. Each of elements 16 and 50 in FIG. 2 has a thickness equal to one-quarter of the same wavelength (as is the case in the prior art assembly of FIG. 1). It is thus apparent that any received acoustical signal which is coupled through layers 50 and 16 to piezoelectric element 14 will result in the generation of an electrical signal by element 14 which will be one wavelength out of phase with the electrical signal developed by piezoelectric element 50. The circuitry shown by the dashed lines in FIG. 2 includes a delay element 48 which operates on the signal generated by layer 50. This signal is delayed by one wavelength and then added by adder 54 to the signal generated by layer 14 which is extended over conductor 46 to the adder. The resulting sum on output terminal 52 thus consists of two in-phase signals. While the primary component is derived from layer 50 which serves as the receiving element, the signal is enhanced by the acoustical signal which is operated upon by transmitting layer 14 and converted to an electrical signal. In this manner, the signal-to-noise ratio of the overall assembly can be increased.

Although the invention has been described with reference to a particular embodiment, it is to be understood that this embodiment is merely illustrative of the application of the principles of the invention. Numerous modifications may be made therein and other arrangements may be devised without departing from the spirit and scope of the invention.

We claim:

1. An ultrasonic transducer assembly comprising a first layer of piezoelectric material, said first layer having electrode coatings on opposite faces thereof and being responsive to an electrical signal applied across said coatings for generating an ultrasound signal; a second layer of piezoelectric material acoustically coupled to said first layer for coupling ultrasound signals generated by said first layer to an interrogation medium, said second layer having electrode coatings on opposite faces thereof and being responsive to an ultrasound signal echo received from said interrogation medium following the generation of an ultrasound signal by said first layer for generating an electrical signal, said second layer being acoustically coupled to said first layer by an intermediate matching layer; and means for enhancing the electrical signal generated by said second layer, said enhancing means including means for adding to the electrical signal generated by said second layer an in-phase electrical signal which appears across said first layer.

2. An ultrasonic transducer assembly in accordance with claim 1 wherein said adding means includes means for delaying one of said electrical signals generated by said second layer or the electrical signal which appears across said first layer prior to adding them together.

3. An ultrasonic transducer assembly comprising a first layer of piezoelectric material, said first layer having electrode coatings on opposite faces thereof and being responsive to an electrical signal applied across said coatings for generating an ultrasound signal; a second layer of piezoelectric material acoustically coupled to said first layer for coupling ultrasound signals generated by said first layer to an interrogation medium, said second layer having electrode coatings on opposite faces thereof and being responsive to an ultrasound signal echo received from said interrogation medium following the generation of an ultrasound signal by said first layer for generating an electrical signal; and means for enhancing the electrical signal generated by said second layer, said enhancing means including means for adding to the electrical signal generated by said second layer an in-phase electrical signal which appears across said first layer.

4. An ultrasonic transducer assembly in accordance with claim 3 wherein said adding means includes means for delaying one of said electrical signals generated by said second layer or the electrical signal which appears across said first layer prior to adding them together.

* * * * *